(12) United States Patent
Mashino et al.

(10) Patent No.: US 6,699,787 B2
(45) Date of Patent: *Mar. 2, 2004

(54) SEMICONDUCTOR DEVICE AND METHOD OF PRODUCTION OF SAME

(75) Inventors: Naohiro Mashino, Nagano (JP); Mitsutoshi Higashi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/162,587

(22) Filed: Jun. 6, 2002

(65) Prior Publication Data

US 2002/0190375 A1 Dec. 19, 2002

(30) Foreign Application Priority Data

Jun. 14, 2001 (JP) .......................................... 2001-180891

(51) Int. Cl.[7] .............................................. H01L 21/44
(52) U.S. Cl. ...................... 438/667; 438/612; 438/666; 438/109; 438/108
(58) Field of Search ................................ 438/612, 666, 438/667, 109, 108

(56) References Cited

U.S. PATENT DOCUMENTS

| 6,429,096 B1 | * | 8/2002 | Yanagida | ..................... 438/459 |
| 6,534,874 B1 | * | 3/2003 | Matsumura | ................. 257/777 |
| 2002/0190371 A1 | * | 12/2002 | Mashino et al. | ............ 257/690 |

* cited by examiner

*Primary Examiner*—Amir Zarabian
*Assistant Examiner*—Christy Novacek
(74) *Attorney, Agent, or Firm*—Staas & Halsey LLP

(57) ABSTRACT

A semiconductor device, enabling reliable electrical connection of a main electrode pad with an interconnection pattern without separate provision of a via use electrode pad in addition to the existing main electrode pad, provided with a silicon substrate (semiconductor substrate), an electronic element formation layer formed on one surface of that silicon substrate, an electrode pad electrically connected to the electronic element formation layer, a through hole passing through the electrode pad and the silicon substrate, an $SiO_2$ film (insulating film), a via hole provided in the $SiO_2$ film on the electrode pad along the opening rim of the through hole, and an interconnection pattern electrically leading out the electrode pad to the other surface of the silicon substrate through the through hole and via hole.

12 Claims, 17 Drawing Sheets

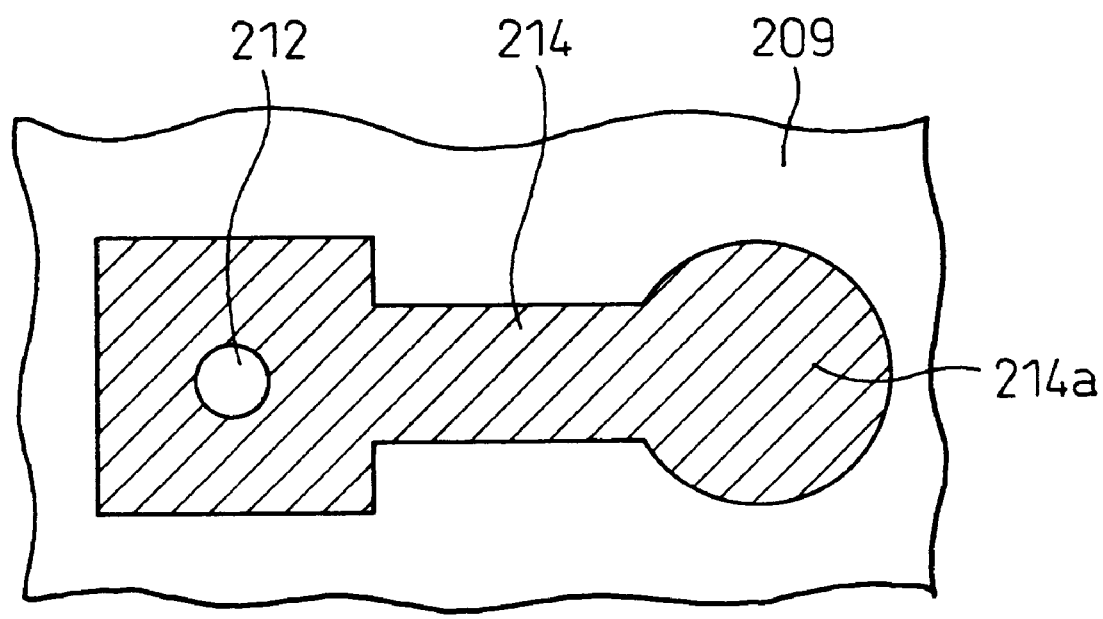

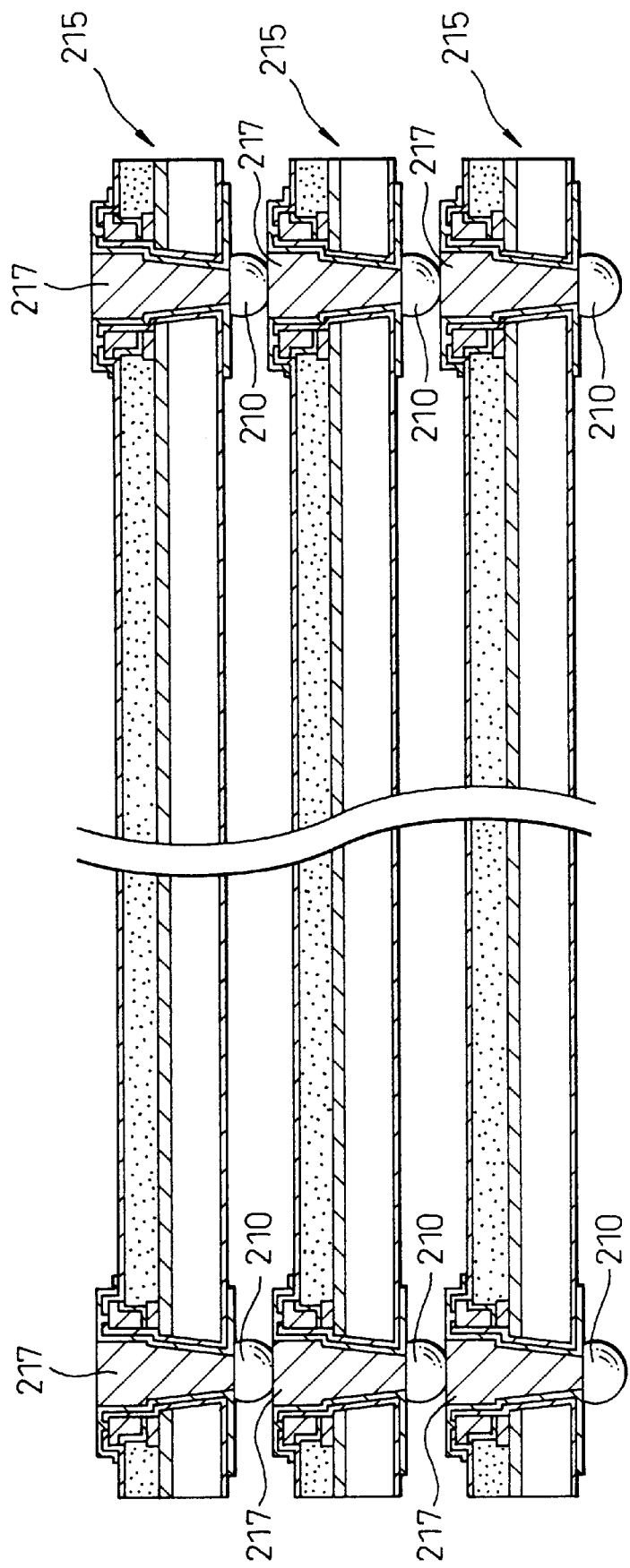

SEMICONDUCTOR DEVICE AND METHOD OF PRODUCTION OF SAME

BACKGROUND OF THE INVENTION

1. Field of the Invention

The present invention relates to a semiconductor device and a method of production of the same, more particularly relates to a technique useful for reducing the size of a semiconductor device.

2. Description of the Related Art

In the past, a semiconductor device to be mounted on a motherboard has been comprised of a semiconductor chip mounted on a wiring board called an "interposer". This interposer has been considered necessary for aligning the positions of the electrode terminals of the semiconductor chip and motherboard.

If an interposer is used, however, the thickness of the semiconductor device increases by the amount of that thickness, so it is preferable not to use such an interposer as much as possible so as to meet with the recent demands for reducing the size of electronic equipment.

Therefore, in recent years, effort has been underway to develop a semiconductor device not requiring an interposer. A sectional view of such a semiconductor device of the related art is shown in FIG. 12A.

The semiconductor device 101 of the related art is mainly comprised of a silicon substrate 102 and does not have an interposer. One surface 102a of the silicon substrate 102 has formed on it an electronic element formation layer 103 including a transistor or other electronic element. This is electrically connected with a via hole electrode pad 110. An insulating film 104 prevents electrical connection of the via hole electrode pad 110 or main electrode pad 105 with the silicon substrate 102.

The semiconductor element formation layer 103 and via hole electrode pad 110 have stacked over them an $SiO_2$ film 106 and an interconnection pattern 107. The $SiO_2$ film 106 has a via hole 106a opened in it. The interconnection pattern 107 and via hole electrode pad 110 are electrically connected through this opening.

The via hole electrode pad 110 is provided integrally with the main electrode pad 105. Further, the main electrode pad 105 and the silicon substrate 102 under it have a through hole 102c opened in them.

The through hole 102c is a characterizing feature of this type of semiconductor device and is provided to lead out the interconnection pattern 107 to the other surface 102b of the silicon substrate 102. The interconnection pattern 107 led out to the other surface 102b is provided with solder bumps 108 functioning as external connection terminals to be aligned in position with the terminals of the motherboard (not shown).

FIG. 12B is a plan view of the semiconductor device 101 seen from the direction of the arrow A of FIG. 12A. For convenience in explanation, the interconnection pattern 107 is omitted.

The via hole 106a is a wide diameter circle at the bottom of which the via hole electrode pad 110 is exposed.

The semiconductor device 101 is fabricated by building in a structure new to the existing semiconductor device (LSI etc.) 109 shown in section in FIG. 12C. As will be explained using FIG. 12C, the main electrode pad 105 is provided at the existing semiconductor device 109 as well. This is the location where originally bonding wires, stud bumps, etc. are bonded, signals are input and output, and power is supplied.

On the other hand, the via hole electrode pad 110 (FIG. 12B) is one of the new structures and is not provided in existing semiconductor devices 109. The via hole electrode pad 110 is newly provided to increase the contact area with the interconnection pattern 107 (FIG. 12A) by providing a wide-diameter via hole 106a above it and to prevent peeling with the interconnection pattern 107 due to stress and poor electrical contact arising due to the same.

In this way, in the semiconductor devices of the related art, in addition to the originally present main pad 105, a via hole pad 110 is newly provided as a part for electrical connection with the interconnection pattern 107 and, to ensure reliable electrical connection, a wide-diameter circular via hole 106a is opened above the via hole electrode pad 110.

If this via hole electrode pad 110 is newly provided, however, the planar size of the semiconductor device 101 becomes that much larger. This runs counter to the trend toward smaller sizes of semiconductor devices.

Further, providing the via hole electrode pad 110 in addition to the existing main electrode pad 105 requires that the design of existing semiconductor devices be changed, so places a large burden on manufacturers of semiconductor devices (semiconductor manufacturers).

SUMMARY OF THE INVENTION

An object of the present invention is to provide a semiconductor device, and a method of production of the same, enabling reliable electrical connection between an electrode pad and interconnection pattern without separate provision of a via hole use electrode pad in addition to the existing main electrode pad.

To achieve the object, according to a first aspect of the present invention, there is provided a semiconductor device comprised of a semiconductor substrate; an electronic element formed on one surface of the semiconductor substrate; an electrode pad formed on that one surface and electrically connected with the element; a through hole passing through the electrode pad and the semiconductor substrate; an insulating film formed on at least the other surface of the semiconductor substrate, an inner wall of the through hole, and the electrode pad; a via hole provided in the insulating film on the electrode pad along an opening rim of the through hole; and an interconnection pattern electrically leading out the electrode pad to the other surface of the semiconductor substrate through the through hole and the via hole.

Preferably, the via hole is ring shaped.

Alternatively, preferably the via hole is arc shaped and a plurality of the via holes are provided.

Alternatively, preferably the via hole is dot shaped and a plurality of the via holes are provided.

Preferably, a diameter of the through hole is larger at a portion passing through the electrode pad than a portion passing through the semiconductor substrate.

Preferably, the electrode pad has a bottom electrode pad comprised of a first metal and a top electrode pad comprised of a second metal having a higher melting point than the first metal and formed on the bottom electrode pad. More preferably, the first metal is aluminum and the second metal is copper.

Preferably, the interconnection pattern electrically leads out the electrode pad to the one surface of the semiconductor substrate as well. It is possible to stack a plurality of these semiconductor devices together and electrically connect interconnection patterns of facing surfaces of each bottom semiconductor device and top semiconductor device through external connection terminals.

In one embodiment, the through holes are filled by a conductor electrically connected with the interconnection patterns. It is possible to stack a plurality of these semiconductor devices and electrically connect conductors filled in corresponding through holes of each bottom semiconductor device and top semiconductor device through external connection terminals.

According to a second aspect of the invention, there is provided a method of production of a semiconductor device comprising the steps of forming an electronic element on one surface of a semiconductor substrate; forming an electrode pad electrically connected with the element on the one surface of the semiconductor substrate; forming a through hole passing through the electrode pad and the semiconductor substrate; forming an insulating film on at least the other surface of the semiconductor substrate, an inner wall of the through hole, and the electrode pad; forming a via hole exposing part of the electrode pad along an opening rim of the through hole by patterning the insulating film; forming a conductive film on the insulating film and in the via hole; and forming an interconnection pattern electrically leading the electrode pad to the other surface of the semiconductor substrate through the through hole and the via hole by patterning the conductive film.

Preferably, the step of forming a through hole includes the steps of forming a first opening in the electrode pad by patterning and forming a second opening in the semiconductor substrate including the element by firing through the first opening a laser beam of a smaller diameter than the diameter of the first opening, the through hole being defined by the first opening and the second opening.

More preferably, the step of forming the first opening and the step of forming the second opening include between them a step of polishing the other surface of the semiconductor substrate to reduce the thickness of the semiconductor substrate.

Preferably, the step of forming the via hole is performed by opening the insulating film by a laser beam.

More preferably, a ring-shaped via hole is formed by firing the laser beam on the insulating film in a ring shape.

Still more preferably, the step of forming an electrode pad includes the steps of forming a bottom electrode pad comprised of a first metal and forming a top electrode pad comprised of a second metal having a higher melting point than the first metal on the bottom electrode pad. Preferably, aluminum is used as the first metal and copper as the second metal.

In one embodiment, by the step of forming the interconnection pattern, the interconnection pattern is formed so that the electrode pad is electrically led out to the one side of the semiconductor substrate as well. It is possible to provide the steps of preparing a plurality of such semiconductor devices and stacking the semiconductor devices in a plurality of layers by electrically connecting the interconnection patterns of the semiconductor device through external connection terminals.

In one embodiment, the method includes a step of filling the through holes by a conductor electrically connected to the conductive film after the step of forming the conductive film. It is possible to provide the steps of preparing a plurality of such semiconductor devices and stacking the semiconductor devices in a plurality of layers by electrically connecting the conductors exposed from openings of corresponding through holes of the plurality of semiconductor devices through external connection terminals.

BRIEF DESCRIPTION OF THE DRAWINGS

These and other objects and features of the present invention will become clearer from the following description of the preferred embodiments given with reference to the attached drawings, wherein:

FIGS. 1A, 1B, and 1C are sectional views of a semiconductor device according to a preferred embodiment of the present invention, wherein FIG. 1B is an enlarged view of a portion in a circle 1B in FIG. 1A, and FIG. 1C is an enlarged view of a portion in a circle 1C in FIG. 1B;

FIG. 3 is a plan view of a semiconductor device according to an embodiment of the present invention shown in FIG. 1A seen from the A side of FIG. 1A;

FIGS. 5A to 5Q are sectional views of steps of producing a semiconductor device according to an embodiment of the present invention, wherein

FIGS. 7A and 7B are sectional views showing the protection of a bottom electrode pad by a top electrode pad when forming a via hole by a laser beam according to an embodiment of the present invention, wherein FIG. 7B shows the portion in the circle 7B in FIG. 7A enlarged;

FIG. 11 is a sectional view of a semiconductor module obtained by stacking a plurality of semiconductor devices with through holes filled by a conductor as shown in FIG. 10 to form a three-dimensional mounting structure; and FIG. 12A and FIG. 12B are a sectional view and a plan view of a semiconductor device of the related art, while

DESCRIPTION OF THE PREFERRED EMBODIMENTS

Figure 1A:
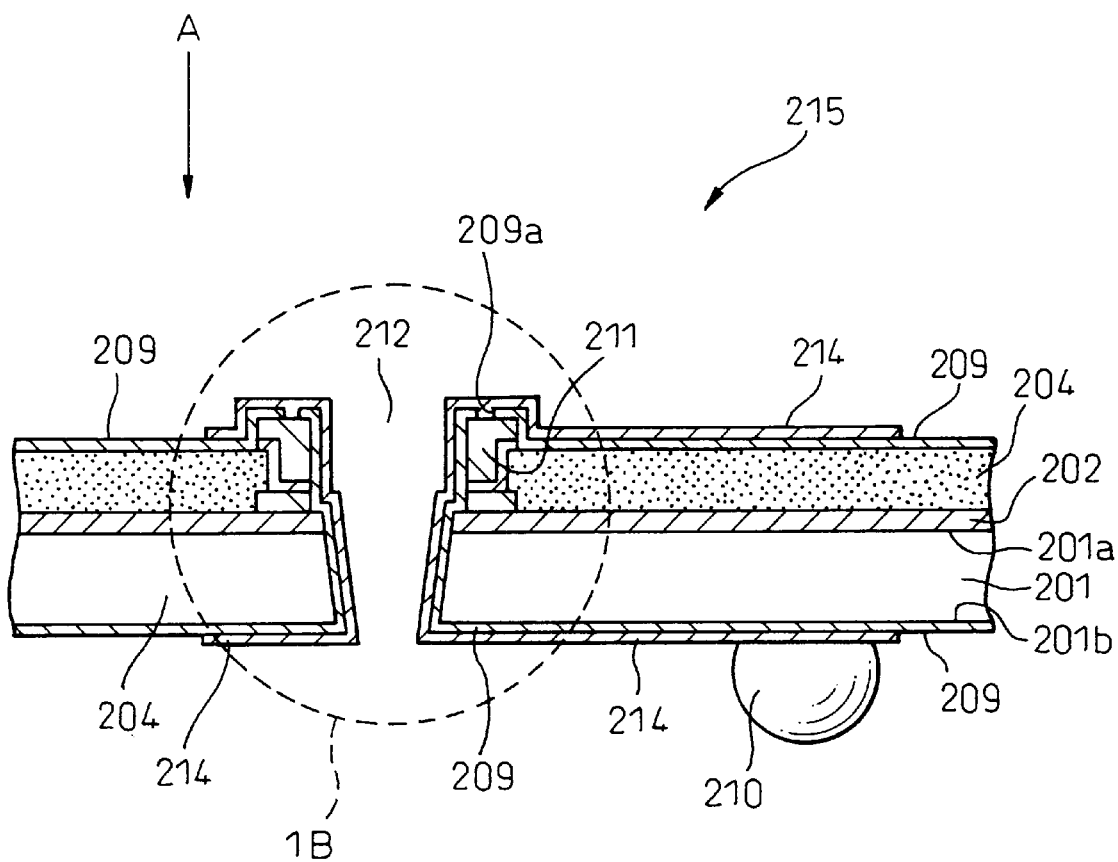

Preferred embodiments of the present invention will be described in detail below while referring to the attached figures.

A semiconductor device according to the present invention is provided with a semiconductor substrate and an electronic element formed on one surface of the semiconductor substrate. An electrode pad electrically connected with this element is formed on that surface of the semiconductor substrate. The electrode pad and the semiconductor substrate have a through hole passing through them. An insulating film is formed on the inner wall of that through hole. This insulating film is further formed on the other surface of the semiconductor substrate and on the electrode pad.

In the insulating film, the portion formed on the electrode pad is provided with a via hole. An interconnection pattern electrically leading the electrode pad to the other surface of the semiconductor substrate through the via hole and the through hole is provided in the semiconductor device.

In particular, in the present invention, by providing the via hole in the insulating film around the opening rim of the through hole, the opening area of the via hole is secured and reliable electrical connection between the interconnection pattern and electrode pad is achieved. Due to this, in the present invention, the via hole electrode pad used in the past to secure the opening area of the via hole becomes unnecessary, so the planar size of the semiconductor device is made smaller than in the past.

Further, the diameter of the through hole is preferably made larger at the portion passing through the electrode pad (hereinafter called the "first opening") than the portion passing through the semiconductor substrate (hereinafter called the "second opening").

According to this structure, compared with when the diameter of the through hole is constant regardless of the location, it is possible to extend the distance between the near open ends of the first opening and second opening, so the insulation between the electrode pad and the semiconductor substrate at the side walls of the through hole is sufficiently secured.

Further, the interconnection pattern may electrically lead out the electrode pad to one surface of the semiconductor substrate.

In this case, by preparing a plurality of such semiconductor devices in a vertical direction and electrically connecting the interconnection patterns of the facing surfaces of each bottom semiconductor device and top semiconductor device through external connection terminals, a three-dimensional mounting structure is obtained. Since the planar size of each semiconductor device is smaller than in the past, this three-dimensional mounting structure keeps down the spread in the lateral direction compared with the past.

When stacking devices in this way, it is possible to fill the through holes by a conductor electrically connected with the interconnection patterns. In this case, the conductors at the locations exposed from the through holes perform the function of the interconnection patterns, so there is no longer a need to form those interconnection patterns and the top and bottom semiconductor devices can be easily stacked.

On the other hand, a method of production of a semiconductor device according to the present invention comprises the steps of:

(a) forming an electronic element on one surface of a semiconductor substrate;

(b) forming an electrode pad electrically connected with the element on the one surface of the semiconductor substrate;

(c) forming a through hole passing through the electrode pad and the semiconductor substrate;

(d) forming an insulating film on at least the other surface of the semiconductor substrate, an inner wall of the through hole, and the electrode pad;

(e) forming a via hole exposing part of the electrode pad along an opening rim of the through hole by patterning the insulating film;

(f) forming a conductive film on the insulating film and in the via hole; and (g) forming an interconnection pattern electrically leading the electrode pad to the other surface of the semiconductor substrate through the through hole and the via hole by patterning the conductive film.

A via hole is formed along the opening rim of the through hole in the insulating film on the electrode pad by the step (e) among these steps. As explained above, due to the formation of this via hole, there is no need to use the via hole electrode pad in the present invention.

Further, step (c) (step of forming a through hole) may further include the steps of (c1) forming a first opening in the electrode pad by patterning and (c2) forming a second opening in the semiconductor substrate including the electronic element by firing through the first opening a laser beam of a smaller diameter than the diameter of the first opening.

Note that when using these steps, the through hole is defined by the first opening and the second opening.

According to steps (c1) and (c2), since a laser beam of a smaller diameter than the diameter of the first opening is fired through the first opening after forming it, the laser beam can be prevented from contacting the first opening and vaporizing the material of the electrode pad, so the danger of the semiconductor substrate and the electrode pad ending up becoming electrically connected by vaporized material is lessened.

In addition, according to the above steps, a structure is obtained in which the diameter of the first opening is larger than the diameter of the second opening. As already explained, this structure has the advantage that insulation between the electrode pad and semiconductor substrate at the side walls of the through hole is sufficiently secured.

Further, steps (c1) and (c2) may include between them a step of polishing the other surface of the semiconductor substrate to reduce the thickness of the semiconductor substrate.

According to this, since the semiconductor substrate is reduced in thickness before forming the second opening, it is possible to form the second opening by firing a laser beam for a short time and the heat damage to the semiconductor substrate arising due to the firing of the laser beam is reduced. Further, since the depth of working by the laser beam becomes shallow, the amount of vaporization of the material by the laser beam is reduced and the amount of the material vaporizing and depositing in the through hole is reduced. Due to this, it is possible to cleanly form the through hole.

Further, step (e) (step of forming the via hole in the insulating film) may be performed by opening the insulating film by a laser beam.

In particular, when forming a ring-shaped via hole, it is preferable to fire the laser beam on the insulating film in a ring shape. The reason for this is that it is sufficient to align the axis of rotation of the laser beam at the through hole when firing it in a ring shape to complete the positioning of the laser source and the insulating film, so the advantage can be obtained that the process time is shortened compared with the case of positioning for every point and firing the laser beam one point at a time.

Further, the invention is not limited to firing the laser beam in a ring shape. When forming the via hole by a laser beam, step (b) (step of forming the electrode pad) may include the following steps:

(b1) forming a bottom electrode pad comprised of a first metal and (b2) forming a top electrode pad comprised of a second metal having a higher melting point than the first metal on the bottom electrode pad.

According to these steps, the electrode pad becomes a two-layer structure of a bottom electrode pad and a top electrode pad. Further, the bottom electrode pad is protected by the top electrode pad having a higher melting point.

When forming a via hole in the insulating film by a laser beam, the laser beam has to pass through the insulating film, but by giving protection by the high melting point top electrode pad as explained above, the laser beam passing through the insulating film is prevented from passing through the electrode pad as well.

Figure 1B:
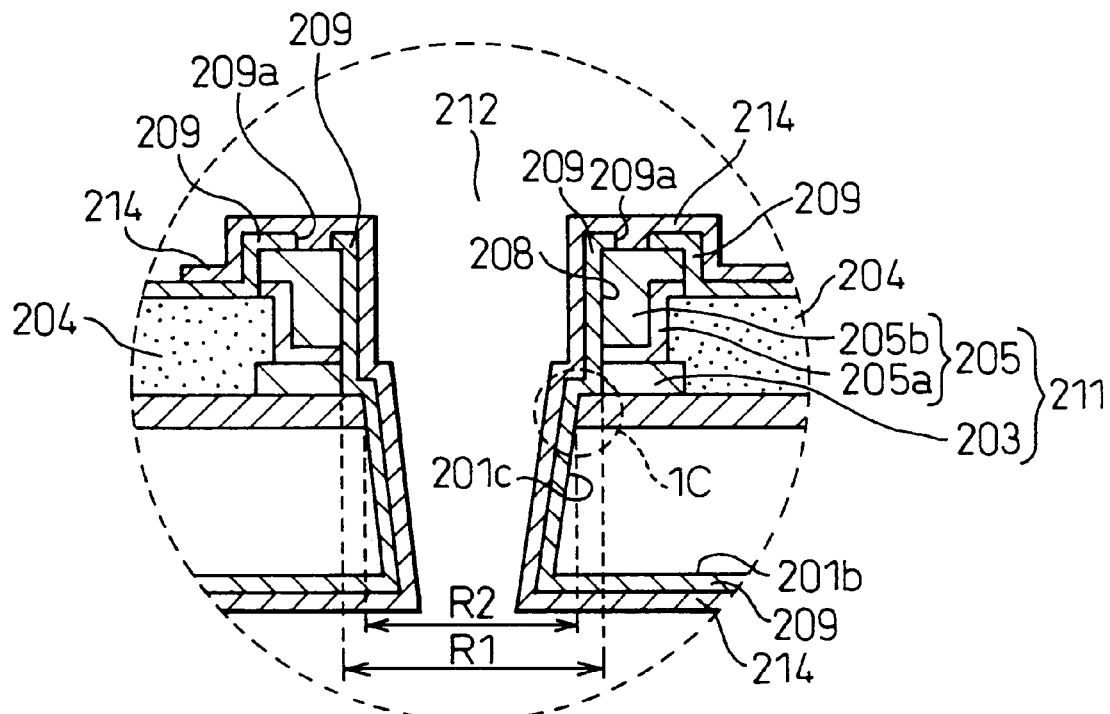
Figure 1C:
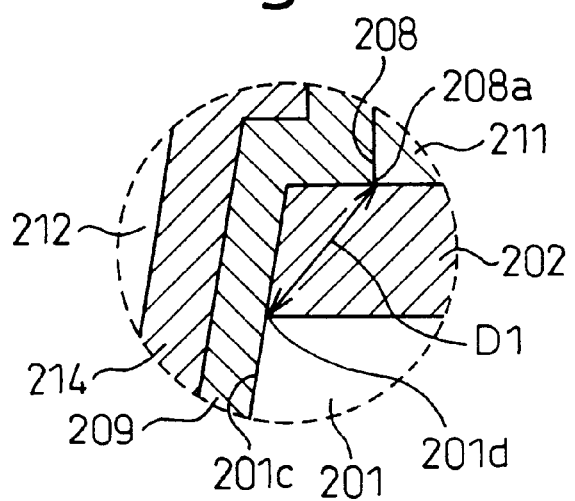

FIGS. 1A, 1B, and 1C are sectional views of a semiconductor device according to a preferred embodiment of the present invention. FIG. 1B is an enlarged view of the area in the circle 1B of FIG. 1A, while FIG. 1C is an enlarged view of the area in the circle 1C of FIG. 1B.

As illustrated, the semiconductor device 215 is provided with a silicon substrate 201 (semiconductor substrate). One surface 201a of this silicon substrate 201 is formed with a semiconductor element formation layer 202 in which a transistor or other electronic element is built. Further, the semiconductor element formation layer 202 has an electrode pad 211 provided on it. While not shown, the electrode pad 211 is electrically connected with an element in the semiconductor element formation layer 202. The electrode pad 211 and silicon substrate 201 have the element formation layer 202 interposed between them. Reference numeral 204 indicates a passivation layer provided to protect the semiconductor element formation layer 202. The layer is for example comprised of $SiO_2$.

Reference numeral 212 indicates a through hole passing through the electrode pad 211 and silicon substrate 201. An $SiO_2$ film 209 (insulating film) is formed on its inner walls. The $SiO_2$ film 209 is also formed on the other surface 201b of the silicon substrate 201 and on the electrode pad 211.

The $SiO_2$ film 209 on the electrode pad 211 is provided with a via hole 209a of a characterizing feature of the present invention. The electrode pad 211 and an interconnection pattern 214 on the $SiO_2$ film are electrically connected through this via hole 209a.

FIGS. 2A to 2D are plan views of the semiconductor device 215 shown in FIGS. 1A to 1C seen from the direction of the arrow A of FIG. 1A (from one surface 201a of the silicon substrate 201) and show various examples of the via holes 209a. Note that in these figures, the interconnection pattern 214 is omitted for facilitating the view of the via hole 209a.

The via hole 209a electrically leads out the bottom electrode pad 211 by the interconnection pattern 214, so naturally is formed on the electrode pad 211. The electrode pad 211 is provided with an existing semiconductor device. That is, in the present invention, the interconnection pattern 214 is electrically connected to an existing electrode pad 211. A separate via hole electrode pad is not provided and connected there as in the related art.

Figure 2A:
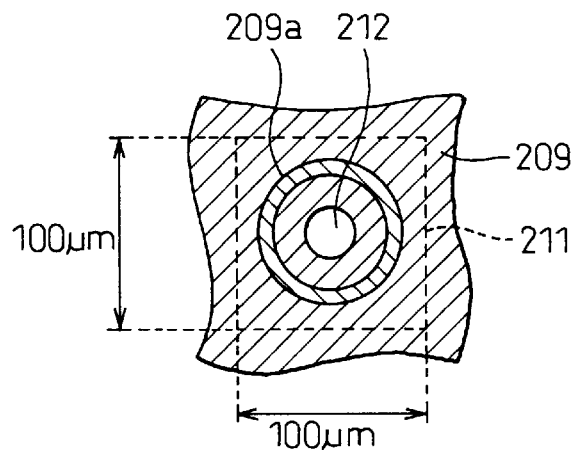
FIGS. 2A, 2B, 2C, and 2D are plan views of various shapes of via holes according to embodiments of the present invention.

As shown in FIG. 2A, the via hole 209a is provided in a ring shape along the opening rim of the through hole 212, so a sufficient opening area is secured for reliably electrically connecting the interconnection pattern 214 and there is therefore no need to separately provide a via hole electrode pad as in the past.

In this way, in the present invention, since the via hole electrode pad is not required, the planar size of the semiconductor device 215 can be made smaller than the past by that amount.

Note that as shown in FIG. 2A, the planar shape of the electrode pad 211 is substantially square with a length of each side of for example about 100 $\mu$m. The planar shape and size of the electrode pad 211, however, are not limited to these. The planar shape and size of the electrode pad 211 may be freely set. The width of the ring-shaped via hole 209a is for example about 5 to 10 $\mu$m, but the invention is not limited to this.

Figure 2B:
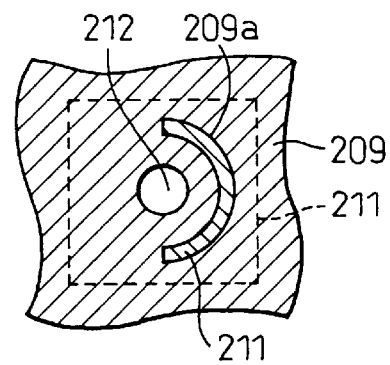
Figure 2C:
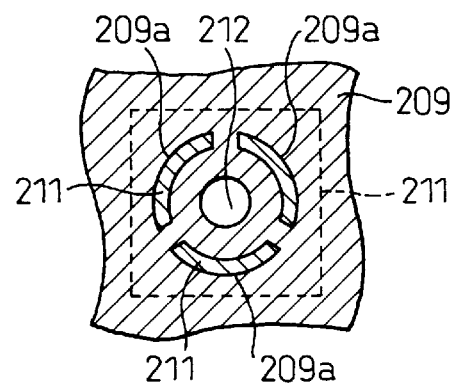
Figure 2D:
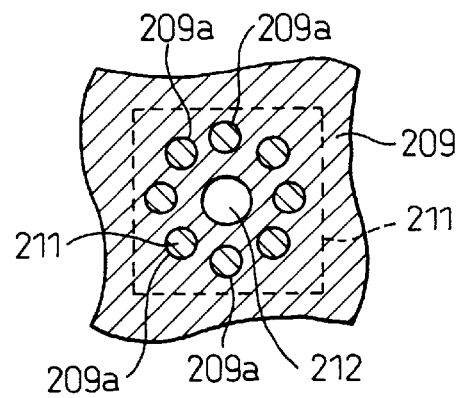

Instead of the ring-shaped via hole 209a of FIG. 2A, it is possible to obtain the same advantages even by via holes 209a shown in FIGS. 2B to 2D.

FIG. 2B is an example of provision of the via hole 209a as an arc along the opening rim of the through hole 212. The arc-shaped via hole 209a need not be a single hole. It is also possible to provide a plurality as shown in FIG. 2C.

FIG. 2D is an example of provision of a plurality of dot-shaped via holes 209a along the opening rim of the through hole 212.

The shape of the via hole 209a is not limited to the above. What is important is that the via hole 209a be provided along the opening rim of the through hole 212. With a via hole 209a provided in this way, the above advantages of the present invention can be obtained.

Refer to FIG. 1B again. The through hole 212 is defined by the first opening 208 and the second opening 201c. Among these, the first opening 208 is the portion passing through the electrode pad 211, while the second opening 201c is the portion passing through the silicon substrate 201.

In the present invention, the diameter R1 of the first opening 208 is made larger than the diameter R2 of the second opening 201c. Specifically, R1 is about 50 to 70 $\mu$m, while R2 is made smaller than R1 or about 25 to 50 $\mu$m. What is important is that R1>R2. The present invention is not limited to the above numerical values.

According to this structure, compared with the case where the diameters R1 and R2 are the same, it is possible to extend the distance D1 (FIG. 1C) between the near open ends 208a and 201d of the first opening 208 and second opening 201c. Therefore, it is possible to secure a sufficient insulation between the electrode pad 211 and silicon substrate 201 at the side walls of the through hole 212. Note that when the insulation is not particularly an issue, the diameters R1 and R2 may also be made the same.

In the illustrated example, the second opening 201c is formed tapered, but as explained later, this is due to the formation of the second opening 201c by a laser beam. The shape is not limited to a tapered one. For example, the advantages of the present invention can be obtained even if forming the second opening 201c straight in shape.

Figure 10:
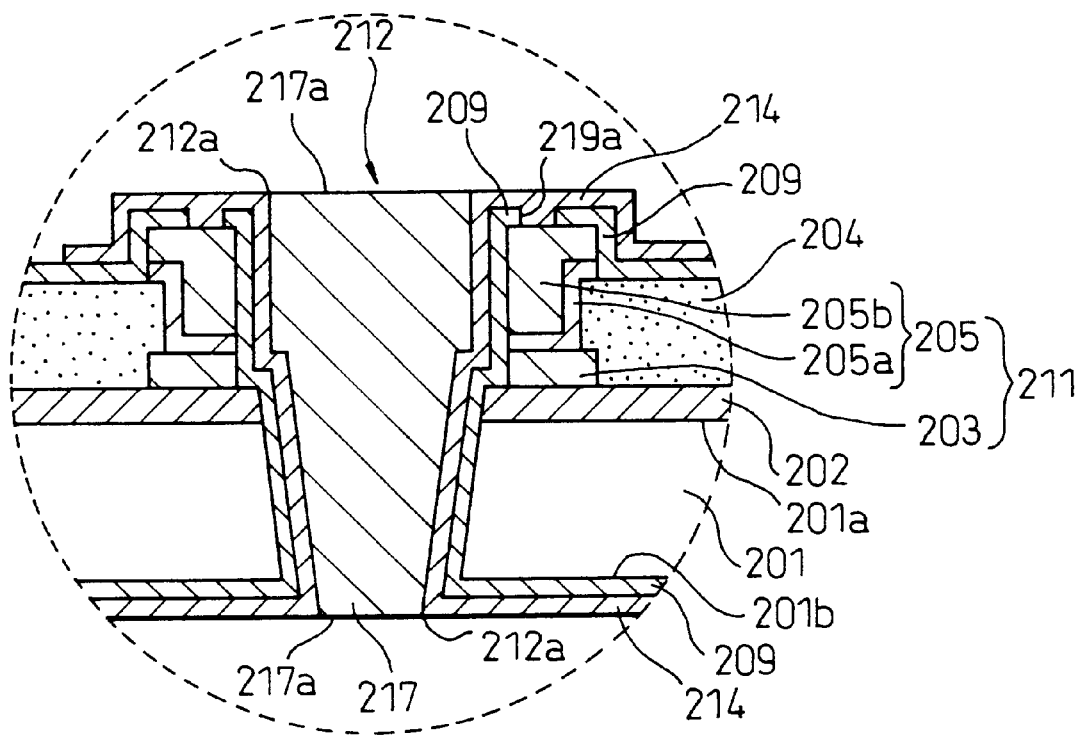
FIG. 10 is an enlarged sectional view of the case of filling a through hole with a conductor according to an embodiment of the present invention.
Figure 12A:
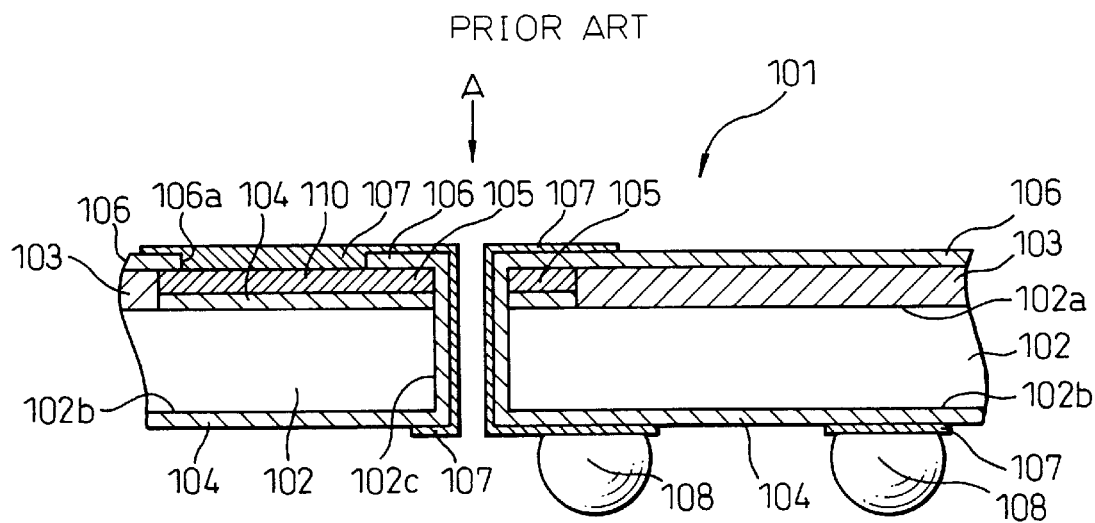
Figure 12B:
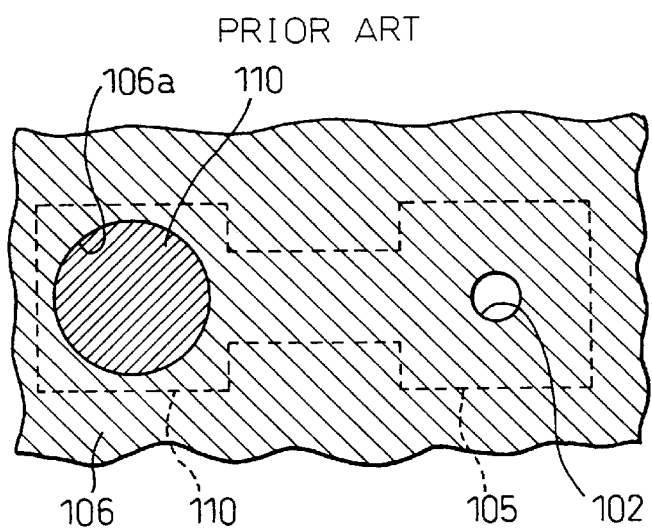
Figure 12C:
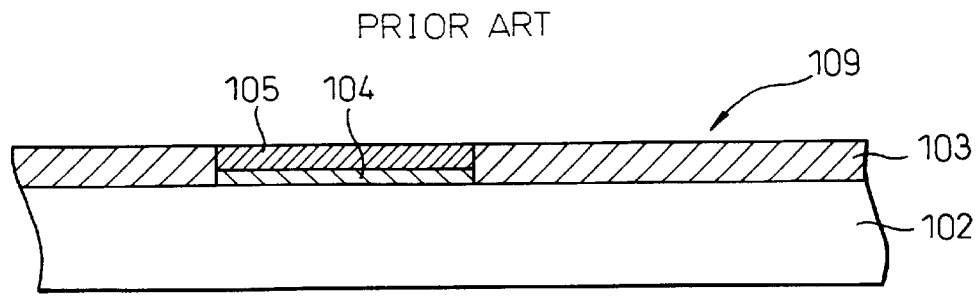
FIG. 12C is a sectional view of a conventional existing semiconductor device.

Further, in the illustrated example, the through hole 212 is hollow, but as shown in FIG. 10, it is also possible to fill the through hole 212 with a conductor 217 electrically connected with the interconnection pattern 214. As the conductor 217 in this case, there is for example copper.

On the other hand, if taking note of the interconnection pattern shown in FIG. 1A, this is formed over the $SiO_2$ film 209 and extends to the other surface 201b of the silicon substrate 201 through the through hole 212. The interconnection pattern 214 functions to electrically connect the electrode pad 211 to the other surface 201b through the via hole 209a and through hole 212.

Predetermined locations of the interconnection pattern 214 lead out in this way are provided with solder bumps 210 functioning as external connection terminals. The external connection terminals, however, are not limited to the solder bumps 210. Stud bumps or other known external connection terminals may also be used.

By causing reflow of the solder bumps 210 in the state with the solder bumps 210 abutting against terminal pads of the motherboard (not shown), the semiconductor device 215 is electrically and mechanically connected on the motherboard.

The semiconductor device 215 may be used alone in this way or may be used stacked as explained above.

FIG. 3 is a plan view of the semiconductor device 215 seen from the A side of FIG. 1A.

The interconnection pattern 214 formed on the surface 201a is provided with a terminal part 214a. This terminal part 214a is provided to electrically lead out the electrode pad 211 to the surface 201a of the silicon substrate 201. When stacking a plurality of semiconductor devices 215 vertically, it is the portion where a solder bump 210 provided by the top semiconductor device 215 is bonded. When there is no need for stacking, however, there is no need to provide the terminal part 214a.

Figure 4:
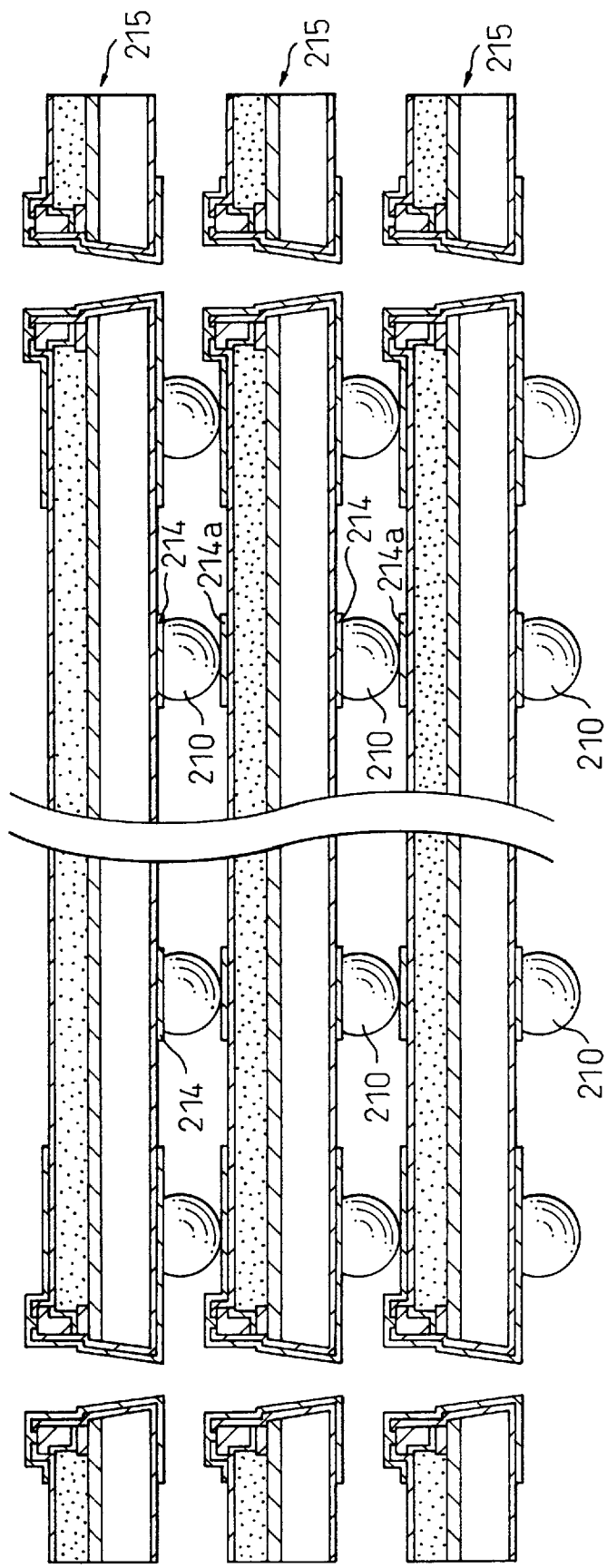
FIG. 4 is a sectional view of a semiconductor module obtained by stacking a plurality of semiconductor devices according to an embodiment of the present invention to obtain a three-dimensional mounting structure.

A sectional view of semiconductor devices 215 stacked in this way is shown in FIG. 4. As shown in FIG. 4, the interconnection patterns of the facing surfaces of each top and bottom semiconductor device 215 are electrically connected through the solder bumps 210. This structure is a three-dimensional mounting structure obtained by stacking a plurality of the semiconductor devices. The planar size of each semiconductor device 215 is smaller than in the related art, so in this three-dimensional structure, it is possible to keep down the lateral spread as compared with the related art. This contributes to the higher density and smaller size of semiconductor packages as sought in recent years.

Note that when filling the through holes 212 with a conductor 217 as shown in FIG. 10, the conductors 217a of the portions exposed from the openings 212a of the through holes 212 can be used instead of the terminal parts 214a, so the terminal parts 214a and the interconnection patterns 214 at the portions where solder bumps 210 are provided are unnecessary and the semiconductor devices 215 can be easily stacked. A sectional view of the semiconductor devices 215 in the case of stacking in this way is given in FIG. 11.

Figure 5A:
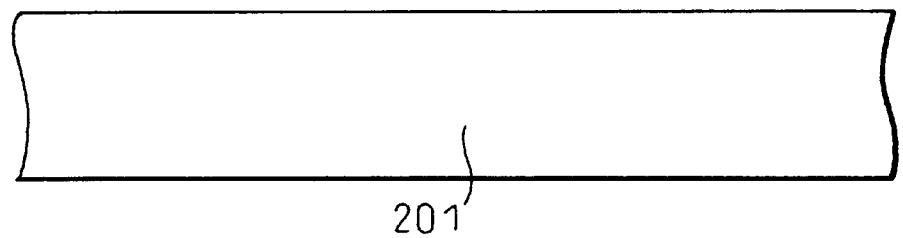

The method of production of the above semiconductor device 215 will be explained next with reference to FIGS. 5A to 5Q. FIGS. 5A to 5Q are sectional views of the semiconductor device in different steps of production.

First, as shown in FIG. 5A, a silicon substrate 201 (semiconductor substrate) is prepared. This silicon substrate 201 is a substrate (wafer) for obtaining a large number of semiconductor devices.

Figure 5B:
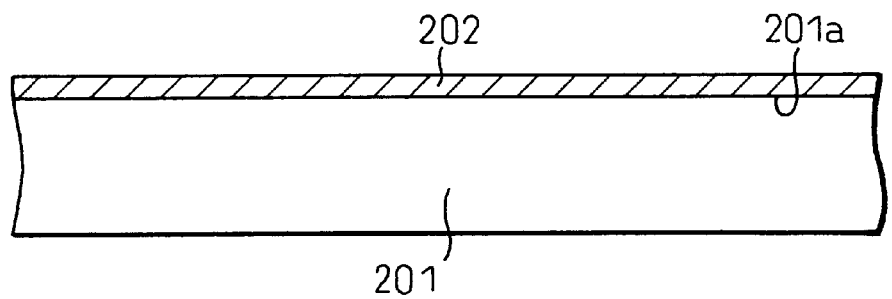

Next, as shown in FIG. 5B, a transistor or other electronic element is formed on one surface 201a of the silicon substrate 201. In the figure, reference numeral 202 shows a semiconductor element formation layer where the semiconductor element is formed.

Figure 5C:
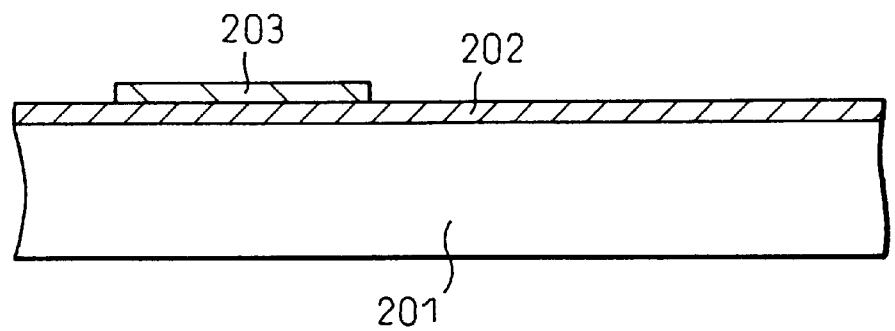

Next, as shown in FIG. 5C, a film (not shown) comprised of aluminum (first metal) is formed on the electronic element formation layer 202 and this film patterned to form the bottom electrode pad 203. The thickness of the bottom electrode pad 203 is about 1 $\mu$m. Note that instead of aluminum, it is also possible to form the bottom electrode pad 203 by copper.

Since the bottom electrode pad 203 and the silicon substrate 201 have the semiconductor element formation layer 202 interposed between them, the bottom electrode pad 203 is positioned above the silicon substrate 201 without contacting the silicon substrate 201. Further, while not particularly shown, the bottom electrode pad 203 is formed so as to be electrically connected with an interconnection layer in the semiconductor element formation layer 202.

Figure 5D:
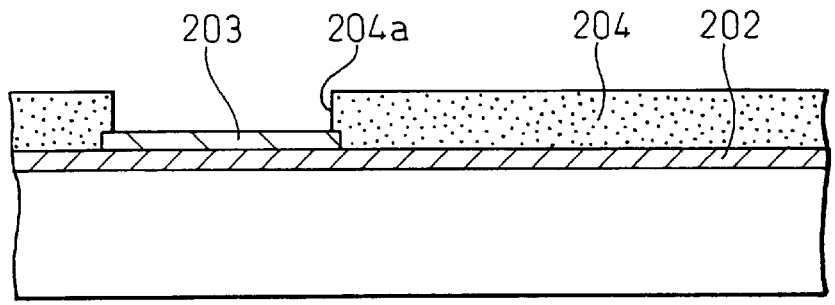

Next, as shown in FIG. 5D, the bottom electrode pad 203 and the semiconductor element formation layer 202 have formed on them a passivation layer 204 comprised of $SiO_2$ etc. Next, this passivation layer 204 is patterned to form an opening 204a where the bottom electrode pad 203 is exposed.

Note that a product in the state shown in FIG. 5D can be obtained from the semiconductor manufacturer. As shown in FIG. 5D, the semiconductor substrate 201 formed with the bottom electrode pad 203 or semiconductor element formation layer 202 and the passivation layer 204 etc. is a general substrate usually produced by semiconductor manufacturers. The bottom electrode pad 203 is originally used as an electrode pad for wire bonding or bonding of external connection terminals (bumps etc.) (main electrode pad 110 in the example of the related art).

Figure 5E:
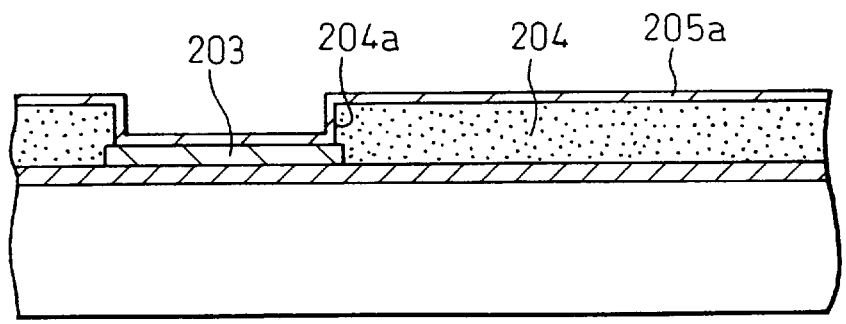

Next, as shown in FIG. 5E, a power feed layer 205a comprised of Cr (chrome) is formed on the passivation layer 204 and the exposed surface of the bottom electrode pad 203. The power feed layer 205a is formed by for example sputtering.

Figure 5F:
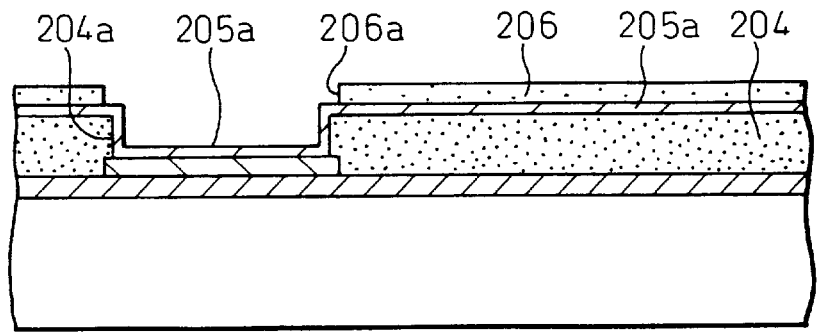

Next, as shown in FIG. 5F, a first photoresist 206 is coated on the power feed layer 205a. Suitably thereafter, the first photoresist 206 is exposed and developed to form the first resist opening 206a superposed with the opening 204a of the passivation layer 204.

Figure 5G:
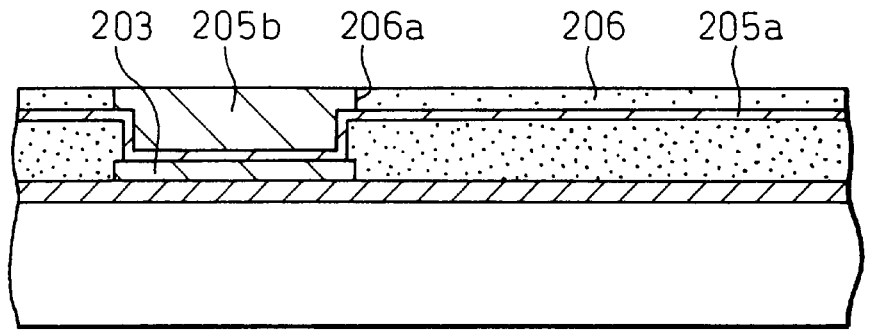

Next, as shown in FIG. 5G, current is supplied to the power feed layer 205a in the state with the power feed layer 205a exposed in the first resist opening 206a immersed in a plating solution (not shown) so as to form the electroplated copper layer 205b.

Figure 5H:
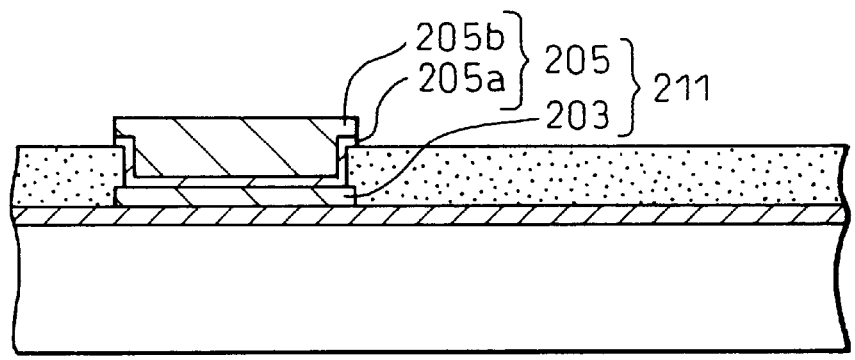

Next, as shown in FIG. 5H, the first photoresist 206 is removed, then the power feed layer 205a which had been formed under the first photoresist 206 is selectively etched to remove it. By the steps up to here, the top electrode pad 205 comprised of the power feed layer 205a and the electroplated copper layer 205b is completed. The thickness of the top electrode pad 205 is about 1 to 25 $\mu$m.

Note that the top electrode pad 205 is mainly comprised of copper (second metal) which has a higher melting point than the aluminum (first metal) comprising the bottom electrode pad 203.

Further, in the present embodiment, the bottom electrode pad 203 and the top electrode pad 205 form the electrode pad 211.

Figure 5I:
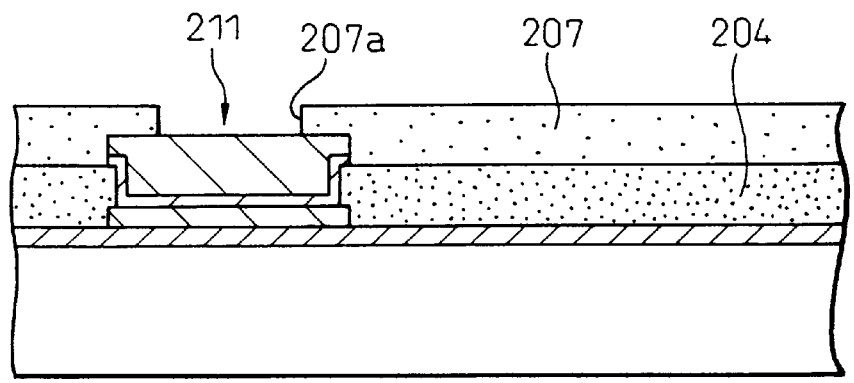

Next, as shown in FIG. 5I, a second photoresist 207 is formed on the passivation layer 204 and the exposed surface of the electrode pad 211. Further, the photoresist 207 is exposed and developed to form a second opening 207a exposing the electrode pad 211.

Figure 5J:
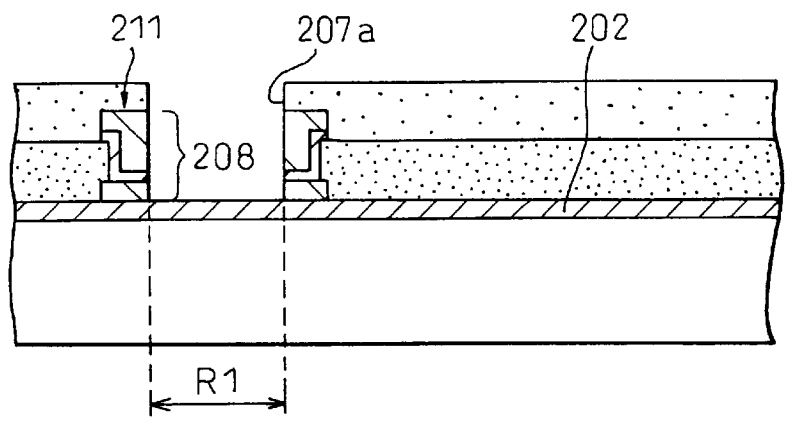

Next, as shown in FIG. 5J, the photoresist 207 is used as an etching mask to pattern the electrode pad 211 and form a first opening 208 in the electrode pad 211. The etching in this case is for example chemical etching or plasma etching. Note that the diameter R1 of the first opening is about 50 to 70 $\mu$m, but should be suitably set in accordance with the diameter of the electrode pad 211.

Figure 5K:
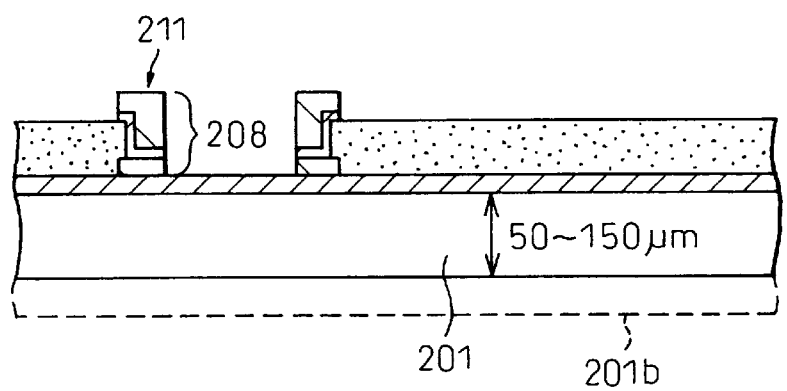

Next, as shown in FIG. 5K, the other surface 201b of the silicon substrate 201 is polished to reduce the thickness of the silicon substrate 201 to about 50 to 150 $\mu$m. By this step, the advantage is obtained that the later completed semiconductor device becomes thin, but when the semiconductor device does not have to be made thin, this step may be omitted.

Figure 5L:
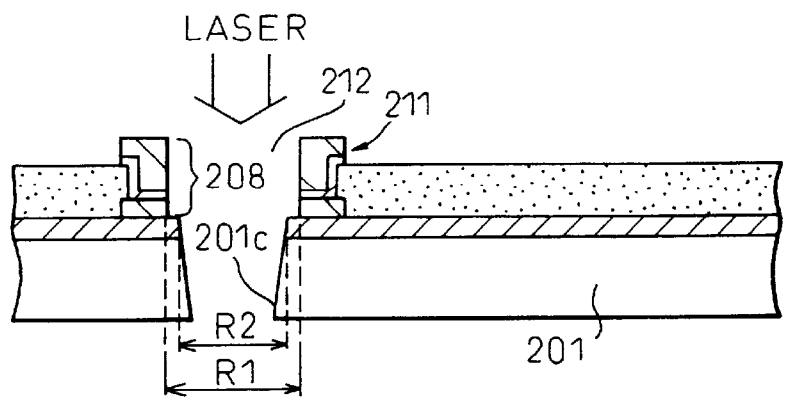

Next, as shown in FIG. 5L, a laser beam having a smaller diameter than the diameter R1 of the first opening 208 is fired through the first opening 208. As an example of the laser, there is a UV laser, YAG laser, or excimer laser. The portion struck by the laser beam vaporizes, whereby a second opening 201c is formed in the silicon substrate 201. The diameter R2 of this second opening 201c is about 25 to 50 μm. Further, the through hole 212 is defined by the first opening 208 and the second opening 201c.

By firing a laser beam of a diameter smaller than the diameter R1 after forming the first opening 208, the laser beam is prevented from contacting the first opening 208 and vaporizing the material of the electrode pad 211 (aluminum or copper), so the danger of vaporized material depositing on the side walls of the through hole 212 and electrically connecting the silicon substrate 201 and electrode pad 211 is reduced.

In addition, a structure where the diameter R1 of the first opening 208 is larger than the diameter R2 of the second opening 201c is obtained. As explained above, this structure has the advantage that the insulation between the electrode pad 211 and the silicon substrate 201 at the side walls of the through hole 212 can be sufficiently secured.

Further, since the silicon substrate 201 is reduced in thickness at the step of FIG. 5K before forming the second opening 201c, it is possible to form the second opening 201c by firing the laser beam for a short time, so heat damage to the silicon substrate 201 arising due to the laser beam can be reduced.

Further, since the depth of working by the laser beam becomes shallow, the amount of the silicon vaporized by the laser beam is reduced and the amount of the silicon which is vaporized and deposits in the through hole 212 is reduced. Due to this, it is possible to cleanly form the through hole 212.

Note that when heat damage or deposition of silicon in the through hole 212 is not an issue, the step of FIG. 5K (step of reducing the thickness of the silicon substrate 201) may be omitted.

Further, while the second opening 201c illustrated is tapered, this is because a laser beam focused to a point by a focusing lens (not shown) instead of a laser beam of parallel light is used. The second opening 201c does not have to be tapered in shape. For example, the advantages of the present invention can be obtained even if the second opening 201c is formed straight in shape.

Further, as shown in FIG. 5L, the second opening 201c may be formed by firing the laser beam from the other surface 201b of the silicon substrate 201 instead of firing the laser beam through the first opening 208. Even when doing this, it is similarly possible to prevent silicon vaporized by the laser from depositing on the electrode pad 211.

Figure 9:
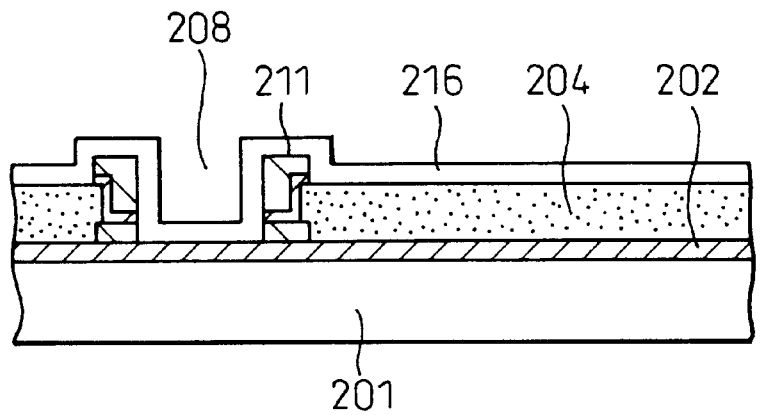
FIG. 9 is a sectional view of a step of forming a protective film performed between the step of FIG. 5K and the step of FIG. 5L according to an embodiment of the present invention.

Still further, the step shown in FIG. 9 may be performed between the steps of FIG. 5K and FIG. 5L. In this step, an SiO$_2$ film or other protective film 216 is formed on the passivation layer 204, on the electrode pad 211, on the side walls of the first opening 208, and on the semiconductor element formation layer 202 exposed from the first opening 208. At the time of laser processing of FIG. 5L, if debris or burrs occur due to the laser beam, these are cleaned away (plasma cleaning or chemical washing). If the protective film 216 is formed as explained above, it is possible to prevent damage to the electrode pad 211 or passivation layer 204 at the time of cleaning.

Figure 5M:
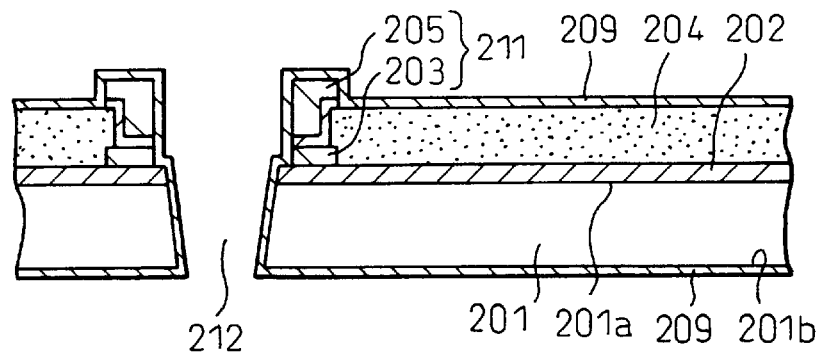

After forming the through hole 212, the step shown in FIG. 5M is performed. In this step, an SiO$_2$ film 209 (insulating film) is formed at least on the other surface 201b of the semiconductor substrate 201, on the inner walls of the through hole 212, and on the electrode pad 211. The SiO$_2$ film 209 is formed by for example chemical vapor deposition (CVD).

Note that to form the SiO$_2$ film 209 on the two main surfaces of the semiconductor substrate 201 as illustrated, for example, first, an SiO$_2$ film 209 may be formed on only the surface 201a of the semiconductor substrate 201 and the side walls of the through hole 212, then the SiO$_2$ film 209 formed on the other surface 201b.

Figure 5N:
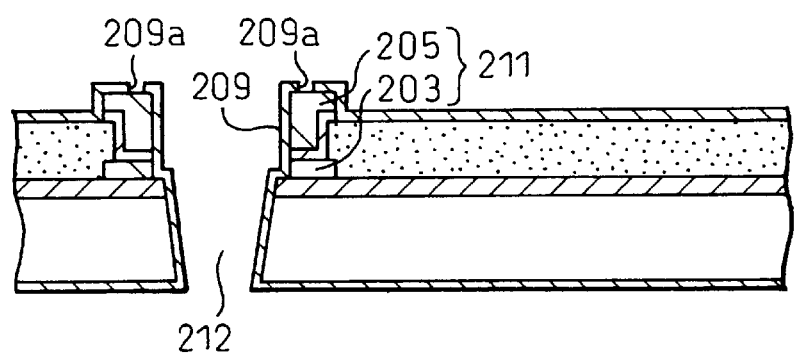

Next, as shown in FIG. 5N, the SiO$_2$ film 209 is patterned to form the via hole 209a exposing part of the electrode pad 211 along the opening rim of the through hole 212. The shape of the via hole 209a is as shown in the already explained FIGS. 2A to 2D.

As the method of forming the via hole 209a shown in any of FIGS. 2A to 2D, for example, it is possible to form a resist (not shown) having an opening corresponding to that shape on the SiO$_2$ film 209 and selectively etch the SiO$_2$ film through that opening. The etching technique used at that time is for example chemical etching or plasma etching.

As another method, it is possible to fire a laser beam at the SiO$_2$ film 209 at the location where the via hole 209a should be formed to cause that portion to vaporize and thereby form the via hole 209a shown in any of FIGS. 2A to 2D.

Figure 6:
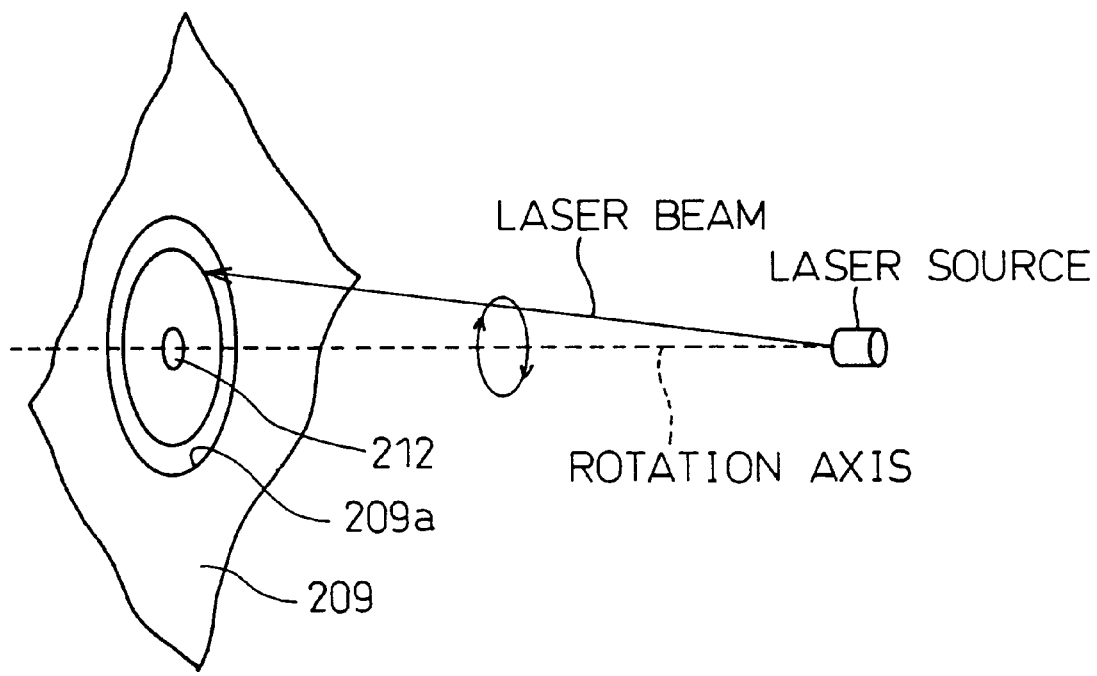
FIG. 6 is a view explaining trepanning of a laser beam in the method of production of a semiconductor device according to an embodiment of the present invention.

In particular, to form a ring-shaped via hole 209a as shown in FIG. 2A, trepanning by the laser beam is suitable. This "trepanning", as shown in FIG. 6, is the method of emitting a laser beam from a laser source and rotating that laser beam about its axis so as to make the laser beam draw a ring shape on the SiO$_2$ film 209.

According to this, by just aligning the axis of rotation when firing the laser beam in the ring shape with the through hole 212, the positioning of the laser source and the SiO$_2$ film 209 is ended, so there is the advantage that the process time is shortened compared with the case of positioning for every point and firing the laser beam point by point.

Note that the method of firing the laser beam is not limited to trepanning. For example, it is also possible to place a light-shielding mask (not shown) having a window of a shape corresponding to the via hole 209a against the laser beam and open the via hole 209a by the laser beam passing through that window.

Here, as shown previously in FIG. 1B, since the electrode pad 211 is made a two-layer structure of a bottom electrode pad 203 and a top electrode pad 205, the following advantages are obtained regardless of the method of firing the laser beam.

Figure 7A:
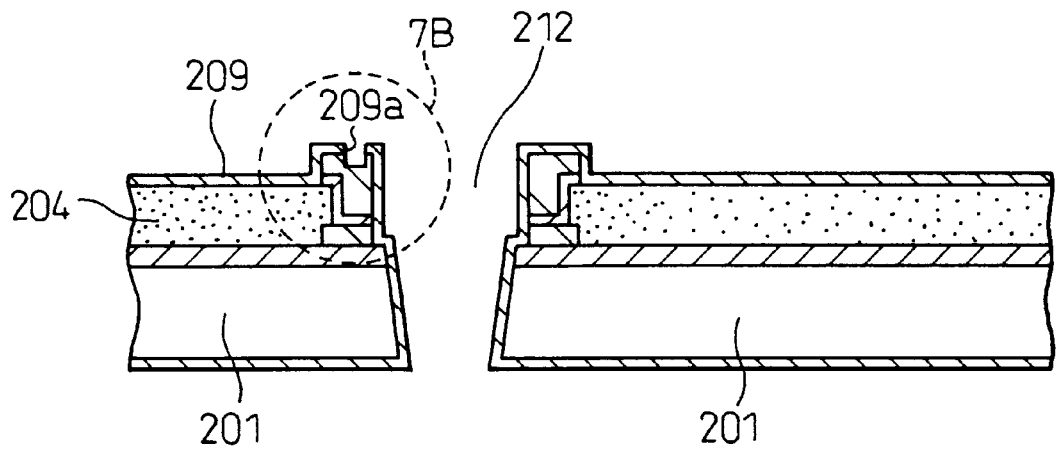
Figure 7B:
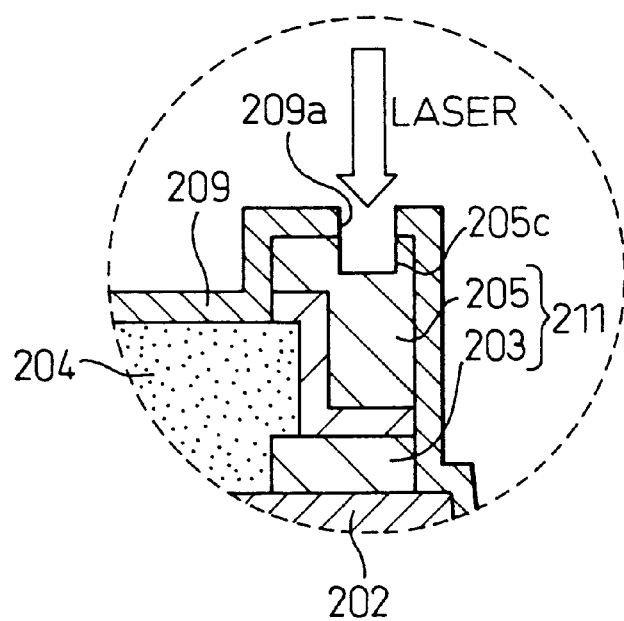

The via hole 209a is a portion where the interconnection pattern 213 is electrically connected with the electrode pad 211, so to ensure reliable connection, it must pass all the way through. Therefore, when forming the via hole 209a so as to pass all the way through, the laser beam is fired by a power and time at least for passing through the SiO$_2$ film 209. At that time, as shown in FIGS. 7A and 7B, part 205c of the top electrode pad 205 also ends up being vaporized by the laser beam. The bottom electrode pad 203, however, is protected by the top electrode pad 205, so the laser beam will not pass through the bottom electrode pad 203 and reach the silicon substrate 201. In particular, a top electrode pad 205 made mainly of copper has a higher melting point than even the bottom electrode pad 203 made mainly of aluminum, so the bottom electrode pad 203 can be effectively protected.

Further, even when the bottom electrode pad 203 is formed by copper, it is possible to protect the bottom electrode pad 203 from the laser beam by an increased thickness of the top electrode pad 205. That is, even when the bottom electrode pad 203 and the top electrode pad 205 are the same material, by thickly forming the top electrode pad 205 and making the electrode pad 211 this two-layer structure, the bottom electrode pad 203 can be protected from the laser beam.

Of course, if the laser beam power and firing time are adjusted so the bottom electrode pad 205 is not passed through, the step of forming the top electrode pad 205 (step of FIGS. 5E to 5H) is unnecessary. Similarly, when forming the via hole 209a by etching, the step of forming the top electrode pad 203 is unnecessary.

Figure 5O:
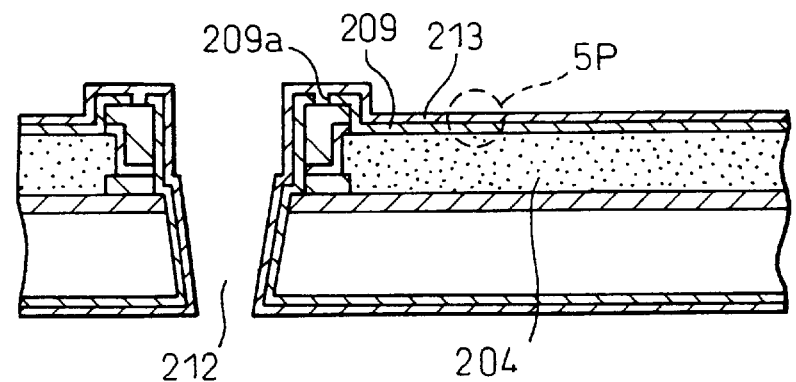

After forming the via hole 209a, the step shown in FIG. 5O is performed. In this step, the conductive film 213 is formed on the $SiO_2$ film 209 and in the via hole 209a. The thickness of the conductive film 213 is about 1 to 20 μm.

Figure 5P:
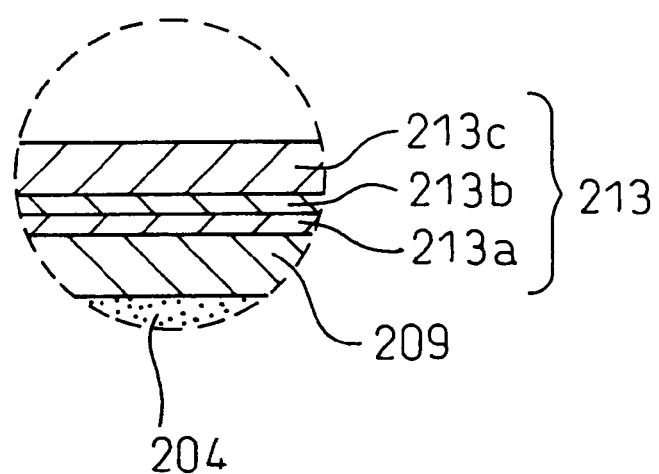
FIG. 5P is an enlarged view of a portion in a circle 5P in FIG. 5O.
Figure 5Q:
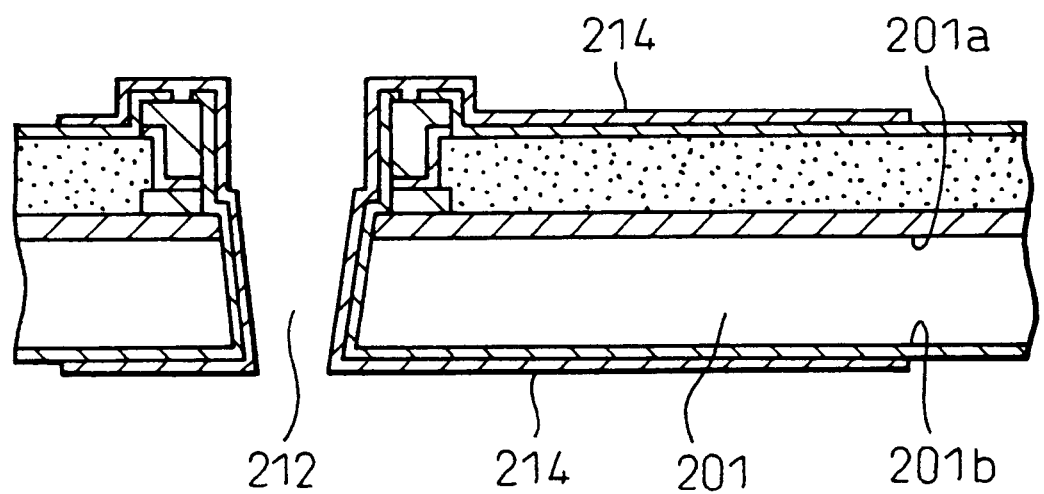

The conductive film 213, as shown in FIG. 5P, is comprised of a Cr (chrome) film 213a formed by sputtering, a copper film 213b formed over it also by sputtering, and an electroplated copper film 213c formed using the Cr (chrome) film 213a and copper film 213b as power feed layers. The structure of the conductive film 213, however, is not limited to this. For example, it is also possible to form an aluminum film by sputtering and use the aluminum film as a conductive film 213. Alternatively, it is possible to form a Cr (chrome) film by sputtering, then form a Cu (copper), Ni (nickel), Au (gold), or other film by elecroless plating or electroplating on the Cr (chrome) film for use as the conductive film 213.

Note that in the illustrated example, the through hole 212 is hollow, but the present invention is not limited to this. For example, it is also possible to fill the inside of the through hole 212 by a conductor 217 comprised of copper by thickly applying the electroplated copper film 213c as shown by the enlarged sectional view of FIG. 10.

The method of filling is not limited to the above method. For example, it is also possible to form the conductive film 213 to a thickness of about 1 to 20 μm, then form a plating resist layer provided with an opening exposing only the side walls of the through hole 212 and electrolytically copper plate the side walls so as to fill the through hole 212 with copper. In this method, the conductive film 213 does not become thick, so it is possible to finely pattern the conductive layer 213 in a later step. Note that whatever the method, the conductor 217 should electrically connect with the conductive film 213.

Next, an explanation will be given of a case of not filling a conductor 217, but the same steps may be used even when filling the conductor 217.

After forming the conductive layer 213, as shown in FIG. 5Q, the conductive film 213 is patterned to form interconnection patterns 214. The interconnection patterns 214 are formed on the two main surfaces 201a and 201b of the silicon substrate 201. The interconnection patterns 214 of the two main surfaces 201a and 201b are electrically connected through the through hole 212.

Next, as shown in FIG. 1A, predetermined locations of the interconnection pattern 214 on the other surface 201b of the silicon substrate 201 are provided with solder bumps 210 serving as external connection terminals, then the substrate is diced, whereby semiconductor devices as shown in FIG. 1A are completed.

The completed semiconductor devices 215 may be mounted alone on a motherboard (not shown) or may be stacked.

Figure 8:
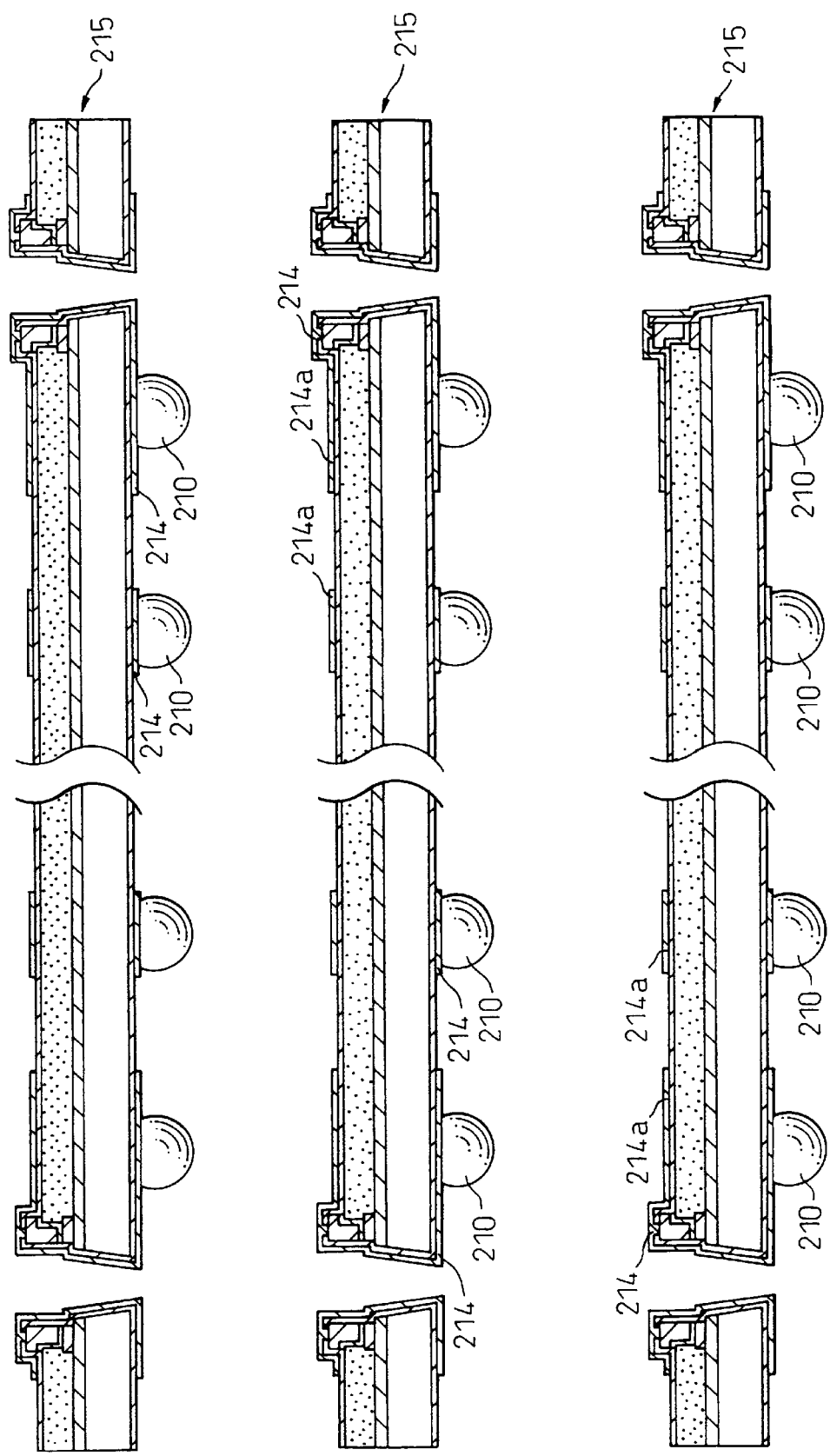
FIG. 8 is a sectional view of the state of preparing a plurality of semiconductor devices for stacking according to an embodiment of the present invention.

When stacking them, as explained in FIG. 3, terminal parts 214a are provided at the interconnection patterns 214. As shown in FIG. 8, a plurality of the completed semiconductor devices 215 are prepared.

Next, as shown in FIG. 4, the solder bumps 210 are made to reflow in the state with the solder bumps 210 abutting against the terminal parts 214a of the bottom semiconductor devices 215. After reflow, the temperature of the solder bumps 215 falls, whereby a semiconductor module of a three-dimensional mounting structure comprised of a large number of stacked semiconductor devices 215 is completed.

Further, when filling the through holes 212 with the conductor 217, as shown in FIG. 11, the conductors 217a of the portions exposed from the openings 212a of the through holes 212 function as the above terminal parts 214a, so the terminal parts 214a and the interconnection patterns 214 of the locations of provision of the solder bumps 210 are unnecessary.

Summarizing the effects of the invention, as explained above, a via hole is provided in the insulating film along the opening rim of the through hole to secure a sufficient opening area of the via hole and reliably electrically connect the interconnection pattern and electrode pad. Due to this, in the present invention, the via hole electrode pad used in the past to secure the opening area of the via hole becomes unnecessary, so the planar size of the semiconductor chip can be made smaller than in the past.

Further, the diameter of the through hole can be made larger at the portion passing through the electrode pad than the portion passing through the semiconductor substrate. If this is done, insulation between the electrode pad and the semiconductor substrate can be sufficiently secured at the side walls of the through hole.

While the invention has been described with reference to specific embodiments chosen for purpose of illustration, it should be apparent that numerous modifications could be made thereto by those skilled in the art without departing from the basic concept and scope of the invention.

The present disclosure relates to subject matter contained in Japanese Patent Application No. 2001-180891, filed on Jun. 14, 2001, the disclosure of which is expressly incorporated herein by reference in its entirety.

What we claim is:

1. A method of production of a semiconductor device comprising:

forming an electronic element on a first surface of a semiconductor substrate;

forming an electrode pad electrically connected with said electronic element on said first surface of the semiconductor substrate;

forming a through hole passing through said electrode pad and said semiconductor substrate;

forming an insulating film on at least a second surface opposite the first surface of said semiconductor substrate, an inner wall of said through hole, and said electrode pad;

forming a via hole exposing part of said electrode pad along an opening rim of said through hole by patterning said insulating film;

forming a conductive film on said insulating film and in said via hole; and forming an interconnection pattern electrically leading from said electrode pad to the second surface of said semiconductor substrate through said through hole and said via hole by patterning said conductive film.

2. The method of production of a semiconductor device as set forth in claim 1, wherein said forming a through hole further comprises:

forming a first opening in said electrode pad by patterning and forming a second opening in said semiconductor substrate including said electronic element by firing, through said first opening, a laser beam of a smaller diameter than the diameter of said first opening, said through hole being defined by said first opening and said second opening.

3. The method of production of a semiconductor device as set forth in claim 2, wherein, after the forming of the first opening and before the forming of the second opening, polishing the second surface of the semiconductor substrate to reduce the thickness of the semiconductor substrate.

4. The method of production of a semiconductor device as set forth in claim 1, wherein the forming of the via hole is performed by opening said insulating film by a laser beam.

5. The method of production of a semiconductor device as set forth in claim 4, further comprising forming a ring-shaped via hole by firing said laser beam, formed in a ring shape, on said insulating film.

6. The method of production of a semiconductor device as set forth in claim 4, wherein said forming of an electrode pad comprises forming a bottom electrode pad comprised of a first metal and forming a top electrode pad comprised of a second metal having a higher melting point than said first metal.

7. The method of production of a semiconductor device as set forth in claim 6, further comprising using aluminum as said first metal and using copper as said second metal.

8. The method of production of a semiconductor device as set forth in claim 1, wherein forming of said interconnection pattern further comprises forming said interconnection pattern so that said electrode pad is electrically led out to the first surface of said semiconductor substrate.

9. A method of production of a semiconductor module, comprising:

preparing a plurality of semiconductor devices produced by the method set forth in claim 8; and stacking said semiconductor devices in a plurality of layers by electrically connecting the interconnection patterns of said plurality of semiconductor devices through external connection terminals.

10. The method of production of a semiconductor device as set forth in claim 1, further comprising filling said through hole by a conductor electrically connected to said conductive film after forming said conductive film.

11. A method of production of a semiconductor module, comprising:

preparing a plurality of semiconductor devices produced by the method set forth in claim 10; and stacking said plurality of semiconductor devices in a plurality of layers by electrically connecting the conductors exposed from openings of corresponding through holes of said plurality of semiconductor devices through external connection terminals.

12. The method of production of a semiconductor device as set forth in claim 5, wherein said forming of an electrode pad comprises forming a bottom electrode pad comprised of a first metal and forming a top electrode pad comprised of a second metal having a higher melting point than said first metal.

* * * * *